US010683202B2

(12) United States Patent
Teo et al.

(10) Patent No.: US 10,683,202 B2
(45) Date of Patent: Jun. 16, 2020

(54) MEMS DEVICE AND METHOD FOR CALIBRATING A MEMS DEVICE

(71) Applicant: NXP USA, Inc., Austin, TX (US)

(72) Inventors: Yean Ling Teo, Goyrans (FR); Aaron A. Geisberger, Austin, TX (US); Laurent Cornibert, Toulouse (FR)

(73) Assignee: NXP USA, Inc., Austin, TX (US)

( * ) Notice: Subject to any disclaimer, the term of this patent is extended or adjusted under 35 U.S.C. 154(b) by 320 days.

(21) Appl. No.: 15/810,386

(22) Filed: Nov. 13, 2017

(65) Prior Publication Data

US 2018/0141805 A1   May 24, 2018

(30) Foreign Application Priority Data

Nov. 22, 2016 (EP) ..................................... 16306538

(51) Int. Cl.
*B61B 7/02* (2006.01)
*B81B 7/02* (2006.01)
(Continued)

(52) U.S. Cl.
CPC .............. *B81B 7/02* (2013.01); *B81B 7/008* (2013.01); *G01D 18/00* (2013.01); *G01L 1/18* (2013.01);
(Continued)

(58) Field of Classification Search
CPC ...................................................... B81B 7/02; B81B 7/008; H01L 29/84; H01L 29/36; H01L 29/167; H01L 23/3114; G01L 1/18; G01D 18/00
See application file for complete search history.

(56) References Cited

U.S. PATENT DOCUMENTS 4,373,399 A * 2/1983 Beloglazov ........... G01L 9/0055
338/22 SD
2014/0253219 A1* 9/2014 Caffee .................... H02N 1/006
327/516
(Continued)

FOREIGN PATENT DOCUMENTS

EP         0195232 A2    9/1986
WO     WO-0029822 A1    5/2000

OTHER PUBLICATIONS

Chiang, Chia-Fang et al; "Resonant Pressure Sensor with On-Chip Temperature and Strain Sensors for Error Correction"; IEEE 26th International Conference on Micro Electro Mechanical Systems; Taipei, Taiwan, Jan. 20-14, 2013; pp. 45-48 (2013).
(Continued)

*Primary Examiner* — David Z Huang
(74) *Attorney, Agent, or Firm* — Charlene R. Jacobsen

(57) ABSTRACT

A microelectromechanical systems (MEMS) device and a method for calibrating a MEMS device. The device includes a first semiconductor substrate including at least one MEMS component. The device also includes an application specific integrated circuit (ASIC) comprising a second semiconductor substrate. The second semiconductor substrate is attached to the first semiconductor substrate. The second semiconductor substrate includes at least one piezoresistive strain gauge. Each piezoresistive strain gauge includes at least one doped semiconductor region having a resistivity that is determined by a strain on said doped semiconductor region. The second semiconductor substrate also includes a circuit for evaluating a trim algorithm for the at least one MEMs component using one or more output values received from the at least one piezoresistive strain gauge.

15 Claims, 3 Drawing Sheets

(51) Int. Cl.
*B81B 7/00* (2006.01)
*G01D 18/00* (2006.01)
*G01L 1/18* (2006.01)
*H01L 23/31* (2006.01)
*H01L 29/167* (2006.01)
*H01L 29/36* (2006.01)
*H01L 29/84* (2006.01)

(52) U.S. Cl.
CPC ........ *H01L 23/3114* (2013.01); *H01L 29/167* (2013.01); *H01L 29/36* (2013.01); *H01L 29/84* (2013.01); *B81B 2201/0235* (2013.01); *B81B 2201/0242* (2013.01); *B81B 2201/0264* (2013.01); *B81B 2207/012* (2013.01)

(56) References Cited

U.S. PATENT DOCUMENTS

2016/0276307 A1* 9/2016 Lin ................. H01L 21/561
2018/0103899 A1* 4/2018 Cahan ................ A61B 5/4851

OTHER PUBLICATIONS

Thomas Tschan et al; "A High-Performance, Low Cost Capacitive Accelerometer Trimmed using Nonvolatile Potentiometers (EEPOT's)"; Transducers '95, Eurosensors IX; 8th Int'l Conf on Solid State Sensors and Actuators, and Eurosensors Ix; Stockholm; Jun. 25-29, 1995; 3 pages.

* cited by examiner

MEMS DEVICE AND METHOD FOR CALIBRATING A MEMS DEVICE

CROSS-REFERENCE TO RELATED APPLICATIONS

This application claims the priority under 35 U.S.C. § 119 of European patent application no. 16306538.6, filed Nov. 22, 2016 the contents of which are incorporated by reference herein.

BACKGROUND

The present specification relates to a microelectromechanical systems (MEMS) device and to a method for calibrating a MEMS device.

One of the biggest challenges for MEMS devices is the mechanical stresses that the an integrated circuit (IC) incorporating MEMS components experiences. These mechanical stresses may, for instance, be associated with the soldering of the IC to a carrier (e.g. a printed circuit board (PCB)) and with any mechanical stresses that may be transferred to the IC through the carrier. These stresses can modify the physical properties of the MEMS components in the device, whereby important parameters of those components, such as elasticity and the dimensions of any capacitive gaps, may be compromised.

Current MEMS devices such as accelerometers and gyroscopes are packaged in a plastic mold. They are typically soldered on to a PCB by the end customer.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a microelectromechanical systems (MEMS) device comprising:

a first semiconductor substrate including at least one MEMS component, and an application specific integrated circuit (ASIC) comprising a second semiconductor substrate, wherein the second semiconductor substrate is attached to the first semiconductor substrate, and wherein the second semiconductor substrate comprises:

at least one piezoresistive strain gauge, each piezoresistive strain gauge comprising at least one doped semiconductor region having a resistivity that is determined by a strain on said doped semiconductor region, and a circuit for evaluating a trim algorithm for the at least one MEMs component using one or more output values received from the at least one piezoresistive strain gauge.

Provision of a piezoresistive strain gauge may allow the effects of strain on the MEMS device to be incorporated into a trim algorithm, for calibrating the device. Since the piezoresistive strain gauge is included in the semiconductor substrate of the ASIC, instead of in the MEMS substrate, the addition of the strain gauge need not complicate or otherwise the affect the manufacture or operation of the MEMS components. Also, incorporation of the piezoresistive strain gauge in the substrate of the ASIC instead of in the MEMS substrate allows for easy integration of the piezoresistive strain gauge with other components of the ASIC, such as circuitry for evaluating the trim algorithm. Although the piezoresistive strain gauge is not located in the MEMS substrate, it may nevertheless provide an accurate measurement of the strain on the device as a whole, which may be used for effective evaluation of the trim algorithm. Moreover, the doped semiconductor region(s) of the piezoresistive strain gauge may conveniently be formed by doping one or more regions of the semiconductor substrate of the ASIC.

The attachment of the second semiconductor substrate of the ASIC to the first semiconductor substrate including the at least one MEMS component may be implemented in a number of ways. As described herein, the inclusion of the at least one piezoresistive strain gauge in the second semiconductor substrate may allow the trim algorithm to be provided with information about the strain in the device as a whole, allowing for calibration of the MEMS components, even though the at least one piezoresistive strain gauge is not located in the first semiconductor substrate along with the MEMS components. It is envisaged that this arrangement may be particularly suited to devices in which the attachment between the first and second substrates is such that strain present in the second substrate is a good indicator of the strain present in the first substrate (for instance, in cases where the attachment between the second semiconductor substrate and the first semiconductor substrate is relatively stiff).

Examples of devices in which the attachment of the second semiconductor substrate to the first semiconductor substrate allows piezoresistive strain gauge(s) in the second substrate to provide useful information to the trim algorithm about the strain in the first semiconductor substrate include those in which the substrates are attached using wafer bonding between the two semiconductor substrates as described herein after in relation to, for instance, FIG. 1 (see the attachment points labelled 8). It is envisaged that wafer bonding using attachment points of this kind would provide a sufficiently rigid attachment of the two substrates, such that the detection of strains present in the second semiconductor substrate using the at least one piezoresistive strain gauge would provide information indicative of the strain present in the first semiconductor substrate.

In another example, it is envisaged that the attachment of the second substrate to the first substrate may be implemented using an adhesive, for instance in the form of a film located in between opposing major surfaces of the two substrates (i.e. with the two semiconductor substrates arranged in a stack). In such examples, it is envisaged that a stiff adhesive (having a high Young's Modulus) may be used, such that strains present in the second substrate are indicative of strains which are present in the first substrate.

In a further example, it is envisaged that devices in which the two semiconductor substrates are not stacked may also allow piezoresistive strain gauge(s) located in the second substrate to provide useful information to the trim algorithm about the strain in the first semiconductor substrate. In such examples, the first and second semiconductor substrates may be located in a side-by-side arrangement on a common die flag of a lead frame of a semiconductor package, thereby attaching the second substrate to the first semiconductor substrate. In this example, strains present in the second semiconductor substrate may be indicative of strains present in the first semiconductor substrate, since forces present within the device may be transferred through the common die flag upon which both semiconductor substrates are located.

Each doped semiconductor region of each piezoresistive strain gauge may be elongate, for improving the accuracy with which the piezoresistive strain gauge may determine the strain on that part of the second substrate.

Each piezoresistive strain gauge may include a plurality of elongate doped semiconductor regions extending along different directions within the second semiconductor substrate (e.g. orthogonal directions, or directions at an angle such as 45° to each other), for determining a strain component for the trim algorithm in each of said different directions. This may improve the accuracy of the trim algorithm.

Each of the directions along which the elongate doped semiconductor regions extend may be located within a plane parallel to a major surface of the second semiconductor substrate. Since most of the strain applied to device is typically in a direction outside this plane, this may improve the accuracy of the trim algorithm.

In one embodiment, one or more piezoresistive strain gauges of the device may include two elongate doped semiconductor regions arranged in a cross. In one embodiment, one or more piezoresistive strain gauges of the device may include three elongate doped semiconductor regions arranged to form an "H". It is envisaged that a device of the kind described herein may include a mixture of different kinds of piezoresistive strain gauges (e.g. one or more cross-type gauges and one or more H-type gauges.

In a device having a plurality of piezoresistive strain gauges, each piezoresistive strain gauge may be located in a different part of the second semiconductor substrate for determining a strain value for the trim algorithm in said location. This may improve the accuracy of the trim algorithm.

Each doped semiconductor region forming the piezoresistive strain gauges may be formed from silicon (e.g. of the second substrate) doped with Boron (for p-type doping) or Phosphorous (for n-type doping). Note that a p-type doped semiconductor region of the kind described herein has a positive coefficient with respect to strain, while an n-type doped semiconductor region has a negative coefficient to strain. Accordingly, it is envisaged that a MEMS device of the kind described herein may include both n-type and p-type doped regions, thereby to increase the sensitivity of the piezoresistive strain gauge(s) of the device. The doping concentration of the doped regions may be chosen according to the required accuracy for the device for trimming the MEMS component(s). For instance, a doping concentration of a region doped with Boron may be in the range $10^{17}$-$10^{20}$, or more particularly in the range $10^{17}$-$10^{18}$.

The first and second semiconductor substrates may form a chip scale package (CSP). The second semiconductor substrate may have a plurality of electrical contacts located on a major surface thereof, for mounting the chip scale package on a surface (such as the surface of a carrier (e.g. printed circuit board (PCB))).

The at least one MEMS component of the device may for instance be a gyroscope, accelerometer, pressure sensor or timing device.

According to another aspect of the present disclosure, there is provided a method for calibrating a microelectromechanical systems (MEMS) device of the kind described above, the method comprising:

at least one piezoresistive strain gauge of the device outputting a value indicative of a resistivity of a doped semiconductor region of the piezoresistive strain gauge, and evaluating a trim algorithm for at least one MEMs component of the MEMS device using the output value(s) received from the at least one piezoresistive strain gauge.

The output value(s) received from the at least one piezoresistive strain gauge may be indicative of components of strain on the MEMS device in at least two substantially orthogonal directions located within a plane parallel to a major surface of the second semiconductor substrate.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
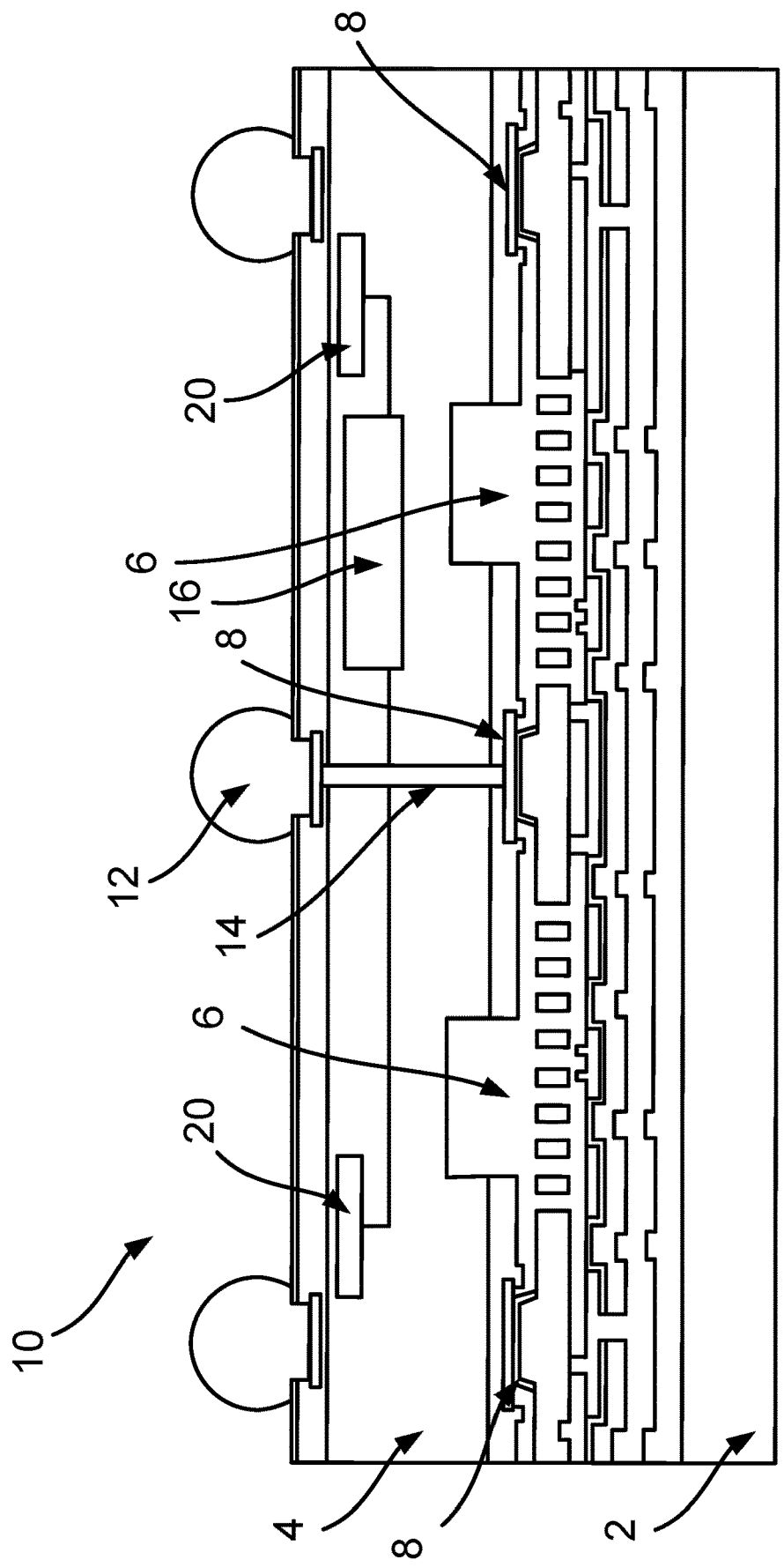
FIG. 1 shows a cross section of a MEMS device in accordance with an embodiment of this disclosure.

FIG. 1 shows a cross section of a MEMS device 10 in accordance with an embodiment of this disclosure. The device 10 includes a first semiconductor substrate 2 and a second semiconductor substrate 4. Each semiconductor substrate 2, 4 may, for instance comprise silicon.

The first semiconductor substrate 2 includes at least one microelectromechanical systems (MEMS) component indicated generally by reference numeral 6. The MEMS components 6 may be located on a major surface of the first semiconductor substrate 2. The MEMS component(s) 6 may, for instance be a gyroscope, accelerometer, pressure sensor, light modulating or steering device, and/or timing device. The MEMS components may, for instance comprise features such as cantilevers, membranes, oscillators, mechanical switches, electrodes etc. The exact configuration of the MEMS component(s) is not essential to the present disclosure, and indeed the MEMS components may be conventional. Accordingly, the details of the MEMS components are not described in the present disclosure in detail.

The second semiconductor substrate 4 forms an application specific integrated circuit (ASIC) of the device 10. The ASIC may include features for operating the MEMS components, such as drive circuitry and circuitry for evaluating a trim algorithm of the device 10 as will be described below in more detail. The second semiconductor substrate 4 is attached to the first semiconductor substrate 2 using wafer bonding, for instance at attachment points 8 in the present example. This form of attachment may provide a stiff attachment between the two substrates 2, 4, such that a strain present in the second substrate 4 is a good indicator of the strain present in the first substrate 2. In other examples, an adhesive may be used to attach the two substrates 2, 4, for instance in the form of a film located in between opposing major surfaces of the two substrates 2, 4. In such examples, wire bonding may be used to provide electrical connections between the substrates 2, 4. In such examples, it is envisaged that a stiff adhesive (having a high Young's Modulus) may be used, such that strains present in the second substrate 4 are indicative of strains which are present in the first substrate 2. In a further example, it is envisaged that devices in which the two semiconductor substrates 2, 4 are not stacked may also allow piezoresistive strain gauge(s) located in the second substrate 4 to provide useful information to the trim algorithm about the strain in the first semiconductor substrate 2. In such examples, the first 2 and second 4 semiconductor substrates may be located in a side-by-side arrangement on a common die flag of a lead frame of a semiconductor package, thereby attaching the second substrate 4 to the first semiconductor substrate 2.

The second semiconductor substrate 4 may be surface mountable on a carrier (e.g. a printed circuit board (PCB)). In particular, the second semiconductor substrate 4 may have a first major surface which is attached to a major surface of the first semiconductor substrate 2, and a second major surface which is mountable on the carrier. The second major surface of the second substrate 4 may include a number of electrical contacts such a solder bumps 12 for making electrical connections with the carrier. The first and second semiconductor substrates 2, 4 may thus form a chip scale package (CSP) mountable on the carrier. Some of the contacts may be connected to the MEMS components 6 on the first semiconductor substrate 2, e.g. by metal filled vias such as the via 14 shown in FIG. 1.

The second semiconductor substrate 4 includes at least one piezoresistive strain gauge 20. The piezoresistive strain gauges 20 may be used to provide data for evaluating a trim algorithm of the device 10. As is known in the art, trim algorithms may be used to calibrate the MEMS components by accounting for, e.g. manufacturing variations or environmental factors such as temperature. As explained above, one such factor is the presence of mechanical stresses within the device 10. These mechanical stresses may, for instance, be associated with the soldering of the IC to a carrier (e.g. a printed circuit board (PCB)) and with any mechanical stresses that may be transferred to the device 10 through the carrier. These stresses can modify the physical properties of the MEMS components 6 in the device 10, whereby important parameters of the MEMS components 6, such as elasticity and the dimensions of any capacitive gaps, may be compromised.

The exact mathematics of the trim algorithm are not essential to the present disclosure, since it will be understood that the trim algorithm may be specific to the type and configuration of the MEMS components themselves. Nevertheless, it will be appreciated that a trim algorithm which includes knowledge of the actual stresses present at one or more locations in the device 10 may in principle allow the presence of such strains to be accounted for during the operation of the device 10. This may improve the accuracy and consistency of readings taken from the MEMS components 6.

In the present example, the device 10 is provided with trim algorithm circuitry 16 shown generally at 16, for evaluating the trim algorithm. The trim algorithm circuitry 16 in this example is connected to the piezoresistive strain gauges 20, thereby to receive one or more output values from the piezoresistive strain gauges 20. Further details of the trim algorithm circuitry 16 will be described below in relation to FIG. 3.

Figure 2:
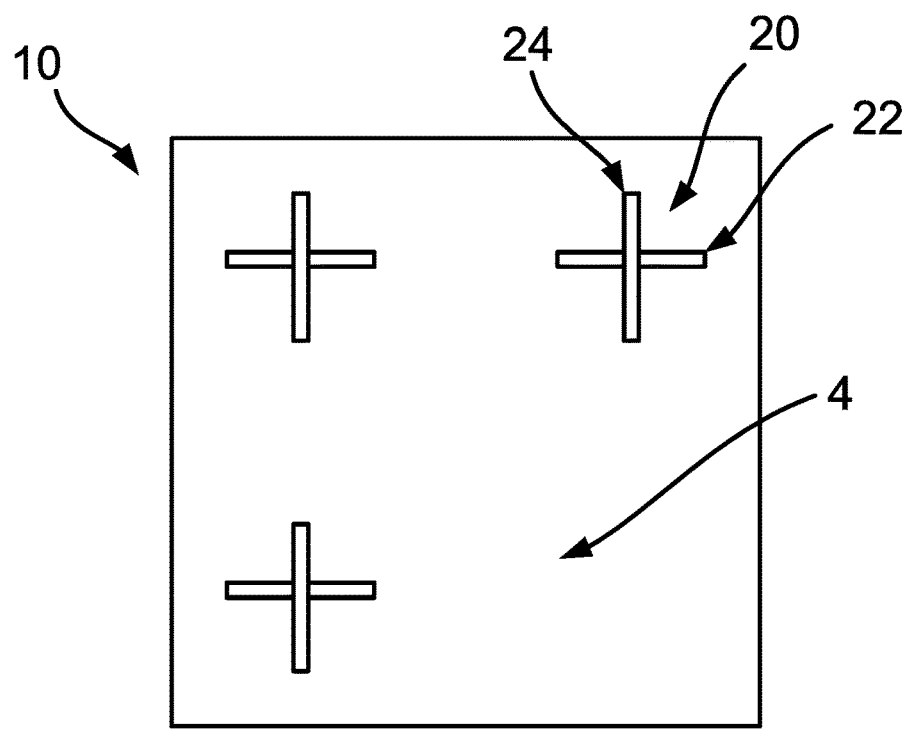
FIG. 2 shows a top view of a MEMS device in accordance with another embodiment of this disclosure.

FIG. 2 shows a top view of a MEMS device in accordance with an embodiment of this disclosure. This view of the device 10 shows more clearly the layout of the piezoresistive strain gauges 20 in the present example. As can be seen in FIG. 2, each piezoresistive strain gauge 20 includes one or more doped semiconductor regions 22, 24 located in the second semiconductor substrate 4.

The piezoresistive strain gauges 20 each operate using the piezoelectric effect, in which a change in strain on the doped semiconductor regions 22, 24 causes a change in resistivity of those doped semiconductor regions 22, 24. By determining the resistivity of the doped semiconductor regions 22, 24, an estimate or determination of the strain in the device 10 may thus be made. It has been found that although the piezoresistive strain gauges 20 are located in the second semiconductor substrate 4 instead of in the first semiconductor substrate 2 along with the MEMS components 6, the piezoresistive strain gauges 20 may still allow useful and accurate data to be produced for use by the trim algorithm circuitry 16. Moreover, because the piezoresistive strain gauges 20 are located in the second semiconductor substrate 4 instead of in the first semiconductor substrate 2, the presence of the piezoresistive strain gauges 20 need not complicate or otherwise the affect the manufacture or operation of the MEMS components 6. Also, incorporation of the piezoresistive strain gauges 20 in the second semiconductor substrate 4 instead of in the first semiconductor substrate 2 may allow for easy integration of the piezoresistive strain gauge with other components of the ASIC, such as the trim algorithm circuitry 16.

The device 10 may include electrodes located at either end of each doped semiconductor region 22, 24 for making resistivity measurements (e.g. by applying a potential across the doped semiconductor regions 22, 24 and measuring the current flow through the doped semiconductor regions 22, 24). These measurements may be outputted to the trim algorithm circuitry 16 as one or more output values, for use in evaluating the trim algorithm of the device 10.

The doped semiconductor regions 22, 24 may be doped using, for instance Boron (for p-type doping) or Phosphorous (for n-type doping). A doping concentration of the Boron may, for instance, be in the range $10^{17}$-$10^{20}$. More particularly, the doping concentration of the Boron may be in the range $10^{17}$-$10^{18}$. Note that a p-type doped semiconductor region of the kind described herein has a positive coefficient with respect to strain, while an n-type doped semiconductor region has a negative coefficient to strain. Accordingly, it is envisaged that a MEMS device of the kind described herein may include both n-type and p-type doped regions, thereby to increase the sensitivity of the piezoresistive strain gauge(s) of the device. The dopants may be introduced into the second semiconductor substrate 4 using, for instance, ion implantation techniques, with appropriate masks being employed to pattern the doped semiconductor regions 22, 24 as desired.

It is envisaged that the doped semiconductor regions of the kind described herein may be located in positions where it is anticipated that maximum difference in strain may occur within the device 10. Typically, these locations may be at the center and at the edges of the device 10 (e.g. in the case where the device 10 is to be soldered to a carrier such as a PCB). It is further envisaged that the doped semiconductor regions of one or more piezoresistive strain gauges of the kind described herein may be placed in specific locations relative to each solder attachment point (e.g. adjacent to each solder attachment point) to give indications of the stress variations often present in the solder process. This may help monitor the stress level at each attachment point (e.g. at each solder ball 12 of the kind described above in relation to FIG. 1).

The doped semiconductor regions 22, 24 may be located beneath the second major surface of the second semiconductor substrate 4. The doped semiconductor regions 22, 24 may be elongate. The doped semiconductor regions 22, 24 may have a long axis, which extends parallel to the plane of the second major surface of the second semiconductor substrate 4.

Figure 3:
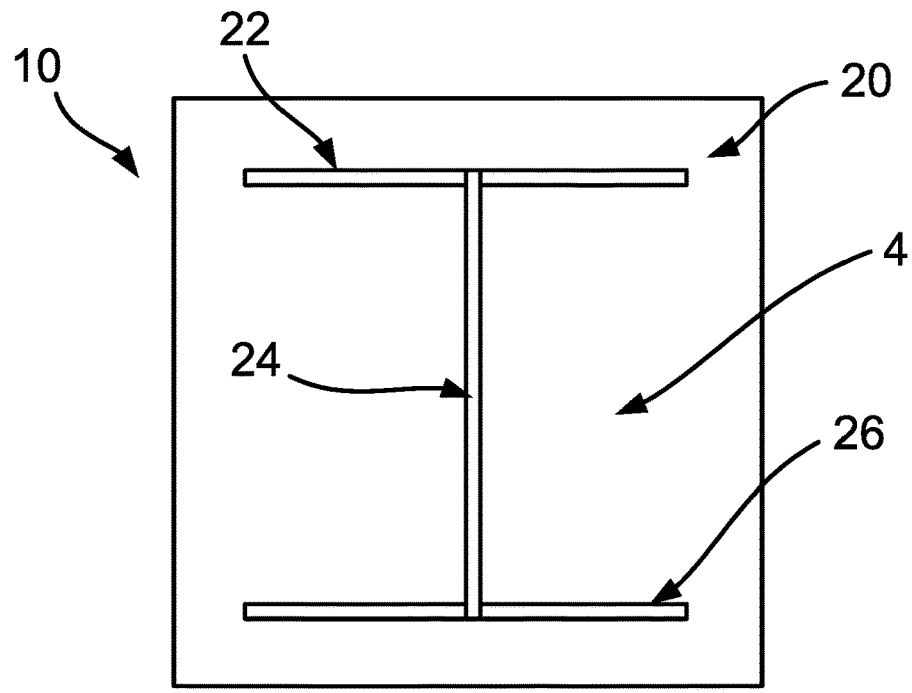
FIG. 3 shows a top view of a MEMS device in accordance with a further embodiment of this disclosure.

As illustrated in the example of FIG. 2, the device 10 may include a plurality of piezoresistive strain gauges 20, although it is also envisaged that the device may include a single piezoresistive strain gauge 20 (see FIG. 3). The provision of multiple piezoresistive strain gauges 20 in the device can allow strain measurements to be made at more than one location within the device 10, thereby to provide spatial information about local variations in the strain within the device 10. This additional information may improve the accuracy of the trimming algorithm.

In the example of FIG. 2, three piezoresistive strain gauges 20 are provided. Each piezoresistive strain gauge 20 in this example is located close to one of the corners of the second semiconductor substrate 4. Each piezoresistive strain gauges 20 in this example comprises two doped semiconductor regions 22, 24 (it is envisaged that in some examples, piezoresistive strain gauges 20 having a single doped semiconductor region may be provided). Each doped semiconductor region 22, 24 is elongate and has its long axis oriented substantially perpendicular to the other doped semiconductor region 22, 24 of that piezoresistive strain gauge 20. In this example, the doped semiconductor regions 22, 24 are arranged in a substantially cross shape (+), and intersect substantially at their midpoints. Other envisaged arrangements in examples having two doped semiconductor regions include L-shaped and X-shaped.

The orientation and location of the piezoresistive strain gauges 20 may be chosen based on factors such the anticipated maximum difference in strain as a function of location within the device 10. In the present example, the piezoresistive strain gauges 20 are oriented with the doped semiconductor regions 22, 24 aligned substantially parallel to the edges of the (rectangular) second substrate 4.

FIG. 3 shows a top view of a MEMS device 10 in accordance with a further embodiment of this disclosure. In the example of FIG. 3, the device has a single piezoresistive strain gauge 20. The piezoresistive strain gauge 20 in this example has three doped semiconductor regions 22, 24, 26. Two of the doped semiconductor regions 22, 26 are arranged to be substantially parallel, with the doped semiconductor region 24 extends substantially perpendicular to the doped semiconductor regions 22, 26 and extends between the mid-points of the doped semiconductor regions 22, 26 (H-shaped). Other envisaged arrangements in examples having three doped semiconductor regions include Y-shaped, N-shaped, Z-shaped, F-shaped and K-shaped.

Again, the orientation and location of the piezoresistive strain gauge 20 may be chosen based on factors such as the anticipated maximum difference in strain as a function of location within the device 10. In the present example, the piezoresistive strain gauge 20 is oriented with the doped semiconductor regions 22, 24, 26 aligned substantially parallel to the edges of the (rectangular) second substrate 4. Note that the H-shaped piezoresistive strain gauge 20 is substantially larger than the cross-shaped piezoresistive strain gauges 20 of FIG. 2. In this way, the H-shaped piezoresistive strain gauge 20 may cover a larger area of the substrate 4, although this may come at the cost of providing less detailed spatial information compared to a device having multiple smaller piezoresistive strain gauges 20.

In a further example, it is envisaged that a piezoresistive strain gauge 20 of a device 10 of the kind described herein may include four doped semiconductor regions. In one such example, a first and a second of the doped semiconductor regions would be arranged similarly to the cross shaped doped semiconductor regions 22, 24 described above in relation to in FIG. 2. The other two doped semiconductor regions would be arranged each at a 45° angle with respect to the first and second doped semiconductor regions, passing through the center of the cross, thereby to form a star shaped arrangement. This would allow the piezoresistive strain gauge 20 to detect strain in multiple directions in the location of the device occupied by the piezoresistive strain gauge 20. In another such example, the four doped semiconductor regions may be arrange in a square configuration (with each doped semiconductor region being position on a respect edge of the square). In this arrangement, the doped semiconductor regions may be connected together to form a Wheatstone bridge, simplifying the readout of the resistivities of the doped semiconductor regions.

It is envisaged that a device 10 according to an embodiment of the present disclosure may include piezoresistive strain gauges 20 of more than one type (e.g. a device 10 may include a cross-shaped piezoresistive strain gauge 20 of the kind shown in FIG. 2 and an H-shaped piezoresistive strain gauge 20 of the kind shown in FIG. 3).

As described above, the device 10 may include doped semiconductor regions which extend in different directions within the device 10 (e.g. substantially orthogonal directions, or directions at an angle such as 45° to each other). This may allow resistivity measurements to be made in more than one direction, thereby to provide directional information about the strain within the device 10 to the trim algorithm.

Figure 4:
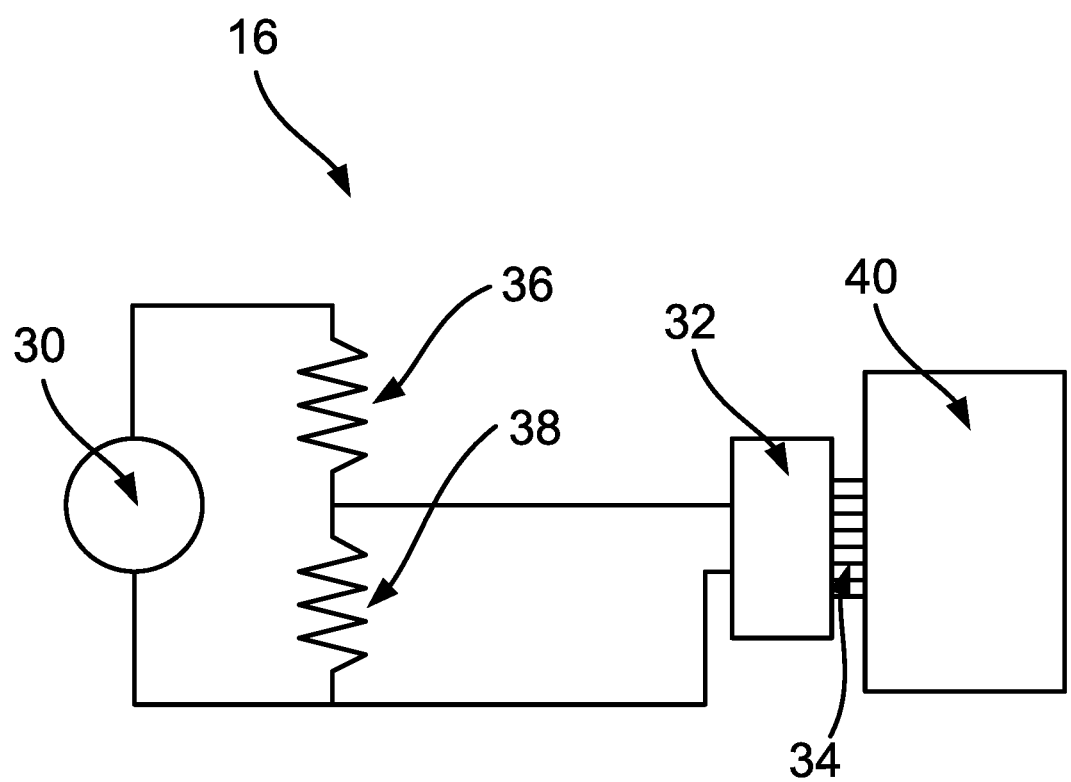
FIG. 4 shows a schematic of a circuit which may be incorporated into a MEMS device in accordance with another embodiment of this disclosure.

FIG. 4 shows a schematic of trim algorithm circuitry 16 which may be incorporated into a MEMS device 10 in accordance with an embodiment of the present disclosure. The trim algorithm circuitry 16 includes a voltage source 30 (e.g. switchable connections to a supply rail of the device 10) for applying a potential across one or more doped semiconductor regions of the kind described above in relation to FIGS. 2 and 3. The resistances associated with these one or more doped semiconductor regions of the piezoresistive strain gauge(s) are represented in FIG. 4 by the resistors 36, 38. The trim algorithm circuitry 16 includes also an analogue to digital converter (ADC) 32 having digital outputs 34, which are connected to a digital section 40. Inputs of the ADC 32 are connected across the resistor 38 in this example. Note that in this example, the resistors 36, 38 form a voltage divider, by which it is possible to compare the ratio of the resistances of the resistors 36, 38. This ratio may be used to determine the relative strains on the two doped semiconductor regions represented by the resistors 36, 38, for use in the trim algorithm. The digital circuitry 40 may include digital components for implementing the trim algorithm of the device 10 using the output values supplied to it by the ADC 32 via the digital outputs 34. The results of the trim algorithm may, for instance, be applied to readings taken from the MEMS components 6, thereby to improve their accuracy and consistency.

Accordingly, a method for calibrating a microelectromechanical systems (MEMS) device 10 of the kind described above may include at least one piezoresistive strain gauge 20 of the device 10 outputting a value indicative of a resistivity of one or more doped semiconductor regions 22, 24, 26 thereof. These outputs may be digitised using an ADC 32. Trim algorithm circuitry 16 may then evaluate a trim algorithm for at least one MEMs component 6 of the MEMS device using the output value(s) received from the at least one piezoresistive strain gauge 20. This can allow the trim algorithm of the device 10 to correct for strain within the semiconductor substrates 2, 4 of the device 10, which may otherwise reduce the accuracy of readings taken using the MEMS components 6 (e.g. owing to modifications of the physical properties of the MEMS components 6, such as changes in elasticity or the dimensions of any capacitive gaps). Note that the trim algorithm may also correct for other factors such as temperature, as is already known in the art of MEMS devices.

Accordingly, there has been described a microelectromechanical systems (MEMS) device and a method for calibrating a MEMS device. The device includes a first semiconductor substrate including at least one MEMS component. The device also includes an application specific integrated circuit (ASIC) comprising a second semiconductor substrate. The second semiconductor substrate is attached to the first semiconductor substrate. The second semiconductor substrate includes at least one piezoresistive strain gauge. Each piezoresistive strain gauge includes at least one doped semiconductor region having a resistivity that is determined by a strain on said doped semiconductor region. The second semiconductor substrate also includes a circuit for evaluating a trim algorithm for the at least one MEMs component using one or more output values received from the at least one piezoresistive strain gauge.

Although particular embodiments of this disclosure have been described, it will be appreciated that many modifications/additions and/or substitutions may be made within the scope of the claims.

The invention claimed is:

1. A microelectromechanical systems (MEMS) device comprising:
a first semiconductor substrate including at least one MEMS component, and
an application specific integrated circuit (ASIC) comprising a second semiconductor substrate,
wherein the second semiconductor substrate is attached to the first semiconductor substrate, and
wherein the second semiconductor substrate comprises:
at least one piezoresistive strain gauge, each piezoresistive strain gauge comprising at least one doped semiconductor region having a resistivity that is determined by a strain on said doped semiconductor region, and
a circuit for evaluating a trim algorithm for the at least one MEMS component using one or more output values received from the at least one piezoresistive strain gauge.

2. The MEMS device of claim 1, wherein each doped semiconductor region is elongate.

3. The MEMS device of claim 2, wherein each piezoresistive strain gauge comprises a plurality of elongate doped semiconductor regions extending along different directions within the second semiconductor substrate, for determining a strain component for the trim algorithm in each of said different directions.

4. The MEMS device of claim 3, wherein each piezoresistive strain gauge comprises at least two elongate doped semiconductor regions extending along substantially orthogonal directions.

5. The MEMS device of claim 3, wherein each said direction is located within a plane parallel to a major surface of the second semiconductor substrate.

6. The MEMS device of claim 3, wherein at least one of said piezoresistive strain gauge(s) comprises two elongate doped semiconductor regions arranged in a cross.

7. The MEMS device of claim 3, wherein at least one of said piezoresistive strain gauge(s) comprises three elongate doped semiconductor regions arranged to form an "H".

8. The MEMS device of claim 1, comprising a plurality of said piezoresistive strain gauges, wherein each piezoresistive strain gauge is located in a different part of the second semiconductor substrate for determining a strain value for the trim algorithm in said location.

9. The MEMS device of claim 1, wherein each doped semiconductor region comprises silicon doped with Boron or Phosphorous.

10. The MEMS device of claim 9, wherein a doping concentration of said Boron is in the range $10^{17}$-$10^{20}$.

11. The MEMS device of claim 1 comprising at least one doped semiconductor region having n-type conductivity and at least one doped semiconductor region having p-type conductivity.

12. The MEMS device of claim 1, wherein said first and second semiconductor substrates form a chip scale package (CSP), and wherein the second semiconductor substrate comprises a plurality of electrical contacts located on a major surface of the second semiconductor substrate for mounting the chip scale package on a surface.

13. The MEMS device of claim 1, wherein the at least one MEMS component comprises a gyroscope, accelerometer, pressure sensor or timing device.

14. A method for calibrating a microelectromechanical systems (MEMS) device comprising:
outputting from at least one piezoresistive strain gauge of the MEMS device a value indicative of a resistivity of a doped semiconductor region of the at least one piezoresistive strain gauge, wherein a second semiconductor substrate comprises the at least one piezoresistive strain gauge, and
evaluating a trim algorithm for at least one MEMS component of the MEMS device using the output value(s) received from the at least one piezoresistive strain gauge, wherein a first semiconductor substrate comprises the at least one MEMS component, and the second semiconductor substrate is attached to the first semiconductor substrate.

15. The method of claim 14, wherein the output value(s) received from the at least one piezoresistive strain gauge are indicative of components of strain on the MEMS device in at least two substantially orthogonal directions located within a plane parallel to a major surface of the second semiconductor substrate.

* * * * *